United States Patent [19]
Kempf

[11] Patent Number: 6,042,936
[45] Date of Patent: Mar. 28, 2000

[54] MICROSPHERE CONTAINING CIRCUIT BOARD PAPER

[75] Inventor: Ulrich W. Kempf, Emaus, Pa.

[73] Assignee: FiberMark, Inc., Brattleboro, Vt.

[21] Appl. No.: 08/936,045

[22] Filed: Sep. 23, 1997

[51] Int. Cl.[7] ............................. B32B 5/16; B32B 9/00
[52] U.S. Cl. .................. 428/323; 428/320.2; 428/375; 428/391; 428/340; 428/446; 428/447; 428/901
[58] Field of Search ........................ 428/323, 320.2, 428/375, 391, 340, 446, 447, 209, 901

[56] References Cited

U.S. PATENT DOCUMENTS

| | | | |
|---|---|---|---|
| 3,895,158 | 7/1975 | Gause et al. | 428/220 |
| 4,134,848 | 1/1979 | Adicoff et al. | 252/63.2 |
| 4,335,180 | 6/1982 | Traut | 428/303 |
| 4,520,067 | 5/1985 | Harris et al. | 428/323 |
| 4,661,301 | 4/1987 | Okada et al. | 264/41 |
| 4,747,897 | 5/1988 | Johnson | 156/148 |
| 4,798,762 | 1/1989 | Okada et al. | 428/285 |
| 4,933,228 | 6/1990 | Katagiri et al. | 428/209 |
| 4,994,316 | 2/1991 | Browne et al. | 428/209 |
| 5,055,342 | 10/1991 | Markovich et al. | 428/137 |
| 5,098,781 | 3/1992 | Minnick et al. | 428/313.5 |
| 5,126,192 | 6/1992 | Chellis et al. | 428/323 |
| 5,308,909 | 5/1994 | Chen, Sr. et al. | 524/494 |
| 5,670,250 | 9/1997 | Sanville, Jr. et al. | 428/323 |

FOREIGN PATENT DOCUMENTS

| | | | |
|---|---|---|---|
| 0455407A2 | 11/1991 | European Pat. Off. | B29C 67/20 |
| 0618258A1 | 10/1994 | European Pat. Off. | C08K 9/08 |
| 3711238A1 | 10/1997 | Germany | H05K 1/03 |
| 51-73089 | 6/1976 | Japan . | |
| 53-18647 | 2/1978 | Japan . | |
| 55-11351 | 1/1980 | Japan . | |
| 56-49257 | 5/1981 | Japan . | |
| 57-34158 | 2/1982 | Japan . | |
| 57-83090 | 5/1982 | Japan . | |
| 57-169344 | 10/1982 | Japan . | |
| 60-167394 | 8/1985 | Japan . | |
| 61-10430 | 1/1986 | Japan . | |
| 61-244511 | 10/1986 | Japan . | |
| 62-46587 | 2/1987 | Japan . | |
| 62-154690 | 7/1987 | Japan . | |
| 62-160787 | 7/1987 | Japan . | |
| 62-162866 | 10/1987 | Japan . | |
| 63-62393 | 3/1988 | Japan . | |
| 160648 | 3/1989 | Japan . | |
| 1215747 | 8/1989 | Japan . | |
| 1235295A | 9/1989 | Japan | H05K 3/46 |
| 2133436 | 5/1990 | Japan . | |
| 315532A | 1/1991 | Japan | B32B 15/08 |
| 5649256 | 5/1991 | Japan . | |
| 3222733 | 10/1991 | Japan . | |
| 3285954 | 12/1991 | Japan . | |
| 413770 | 1/1992 | Japan . | |
| 4268340 | 9/1992 | Japan . | |
| 4295031 | 10/1992 | Japan . | |
| 4302494 | 10/1992 | Japan . | |

OTHER PUBLICATIONS

National Electrical Manufacturers Association (NEMA). Industrial Laminated Thermosetting Products (1989), pp. 1–5, 56, & 61.

Neves, B., Permittivity/Dielectric Constant: DO the Math. Circuitree (Nov. 1996), pp 116 & 118.

Ishii, Y., Polyphenylene Ether/Epoxy Resin Alloy for Low Dielectric PCBs. Circuitree (Nov. 1996), pp 10, 12,16,18 & 20.

Cox, S.M. & Ogden C., Liquid Crystal Polymer High Performance Circuits. Circuitree (Sep. 1996), pp 10, 12, 16, & 18.

Advertisement for glass microspheres by "POLYCLAD" (one page).

*Primary Examiner*—Richard Weisberger
*Attorney, Agent, or Firm*—Elman & Associates

[57] ABSTRACT

A pre-preg substrate, having a low dielectric constant and containing a substantially uniformly distributed hollow-glass-microsphere filler, and method for making the same. The pre-preg substrate is treated with impregnation and lamination techniques to form a laminate with a low dielectric constant, and good mechanical and electrical properties, suitable as a base material for surface mounted devices in high performance circuits. Improved pre-pregs for making high performance circuit boards and for making surface mounted integrated circuits. Improved high performance circuit boards for making surface mounted integrated circuits.

25 Claims, No Drawings

MICROSPHERE CONTAINING CIRCUIT BOARD PAPER

TECHNICAL FIELD OF THE INVENTION

This invention relates to laminar materials for electronic applications, especially where low dielectric constant is important. The invention relates to a low-dielectric-constant circuit board paper or "pre-preg substrate," and a process for making the same, for use in printed circuit board electronic applications.

More particularly, this invention relates to a circuit board paper useful in a printed circuit board structure which may consist of more than one layer. Polymer-resin-reinforced circuit boards may be made with the novel paper. The improved composite circuit board paper, or "pre-preg substrate" of this invention has a low dielectric constant and low electric losses. Circuit boards made of this improved pre-preg substrate are also an invention.

BACKGROUND OF THE INVENTION

Many recent technological advances are made possible by a myriad of electronic devices that function in countless operational devices to facilitate fast and efficient data processing and communication. Modern commerce, and all the associated production, distribution, and communication, could not be achieved without these electronic devices. The circuit board is central to each of these electronic devices.

The increased use of circuit boards in modern electronic devices makes it desirable to produce them with less cost, and ways to produce boards more efficiently are sought by the industry. Yet, as electronic devices are challenged with greater and new tasks, improvements in efficiency and speed of performance are also sought. This places increasing demands on the circuit boards in the devices. The performance and speed of circuits built on the board are directly affected by the dielectric constant of the material from which circuit boards are formed. A material having a lower dielectric constant permits better performance and higher speeds. Thus, to meet the demand for increased speed and higher performance, substrate materials with lower dielectric constants are sought.

Circuit Boards

The National Electronic Manufacturers Association (NEMA) classifies circuit boards on the basis of their composition. Such boards are referred to as FR-1, FR-2, CEM-1 etc; see table 1. A conventional and frequently used printed circuit board, an "FR-4" board, is a laminated composite made of fiberglass fabric impregnated with an epoxy resin.

Circuit boards such as FR-4 boards are produced by impregnating fiberglass fabric with a liquid thermosetting epoxy resin. The impregnated fabric is heated to partially cure the resin and to form a dry, flexible sheet in which the resin is in an intermediate cure state, termed the "B"stage. This dry sheet is termed a "pre-preg" sheet. In further manufacturing steps, sheets of pre-preg are stacked together to a desired thickness and are subjected to heat and pressure that fully cures the resin. This forms a laminated composite in which the resin is said to be in the "C"-stage.

Other conventional methods of producing pre-pregs involve treating paper made from cotton linters and/or bleached kraft fibers with a saturant that is a solution of epoxy resin, catalyst, flame retardant and other ingredients. The saturated paper is then dried by beating to an intermediate temperature to form a B-stage pre-preg. About 99% of the volatile components of the saturated paper are removed by this heating. Laminates are made by stacking three or more of the B-stage pre-pregs together and flanking them on both sides by epoxy-saturated glass cloth, which in turn are flanked by copper foil. A double-clad laminate is formed with copper foil on both sides and a single-clad laminate has copper foil on a single side. The stacked laminate is then pressed between platens and heated to a high temperature for a certain time. When pressed and heated to high temperatures, the resin becomes fluid, and flows to uniformly penetrate the resulting board. Above a certain temperature, crosslinking of the resin is catalytically initiated, and a hard and tough composite structure C-stage laminate is formed. C-stage laminates are usually cooled while under pressure in order to preserve their flatness. The lamination process that converts the B-stage epoxy resin of the pre-preg into C-stage resin also achieves insulation of the circuit layers.

TABLE 1

Types of Conventional Circuit Boards

| GRADE | COMPOSITION | APPLICATION |
| --- | --- | --- |
| FR-1 | Phenolic resin/Kraft paper | Automotive Consumer electronics |
| FR-2 | Phenolic resin/Kraft paper | Automotive Video game controls Consumer electronics |
| FR-3 | Epoxy resin/Kraft paper | Telephone sets |
| FR-4 | Epoxy resin/Glass fabric | Computer applications Telecommunications Military |
| FR-5 | Modified Epoxy resin/Glass fabric | Military applications |
| CEM-1 | Epoxy resin/Glass fabric surface Epoxy resin/Cotton and/or bleached kraft paper core | Consumer electronics |
| CEM-3 | Epoxy resin/Glass fabric surface Epoxy resin/Glass paper core | Computer peripherals Keyboards |

During production of the laminate for printed circuit boards, sheets of pre-preg are usually stacked and bonded to one or two sheets of copper foil so that the final laminated composite consists of dielectric material clad on one or both sides with copper foil. This laminated composite single-clad or double-clad material is fabricated into single- or double-sided printed circuit boards.

Pre-pregs are also used in the production of multilayer printed circuit boards that are used where very high circuit densities are needed. To make multilayer printed circuit boards, "innerlayers" of FR-4 copper clad laminate are fabricated into single- or double-clad circuit boards that are interleaved with one or more sheets of B-stage pre-preg. These multilayer structures are then laminated together under heat and pressure to form C-stage resin that insulates and bonds the innerlayers together.

The electronic systems of modern equipment typically have high signal speeds and operating frequencies. Electronic circuit boards made of materials with low dielectric constants have higher resistivity and decreased capacitive coupling. Higher resistivity and decreased capacitive coupling permit the speed of electronic signal transmission to be increased. Data can be processed at greater speeds. Thus, by using a board with a lower dielectric constant and increased resistivity (compared with alternative materials) the system may be designed with a higher speed of processing electric signals and reduced electric power losses.

Dielectric Constants of Circuit Boards

The dielectric constant (or $E_r$) of a material is a physical characteristic of the material. Printed circuit boards are commonly made of substrates such as paper, nonwoven glass mats and woven glass cloth saturated with polymeric resins. Less common substrates are aramide fibers (woven and nonwoven) and polytetrafluoroethylene (PTFE) cloth.

Standard FR-4 laminate has a relatively high $E_r$, approximately 4.2 at 1 megahertz. This a result of the high $E_r$ contribution of the fiberglass, about 6, averaged with the lower $E_r$ of the epoxy resin, about 3.4.

The polymeric resins used in printed circuit boards are commonly phenolic resins, epoxy resins and modifications of these, e.g. polyesters, cyanoesters, polyimides and PTFE. FR-1, FR-2, FR-3, CEM-1, CEM-3 and FR-4 circuit boards are made from these common materials. The $E_r$ of these printed circuit boards are typically in the range of 4 to 5.

Laminated composites comprised of fiberglass fabric impregnated with fluorocarbon resins are also used in the electronics industry. These laminated composites have an $E_r$ of approximately 2.5 at 1 megahertz. However, fluorocarbon resins suffer from the disadvantage that they are not thermosetting. Composites impregnated with fluorocarbon resins are difficult to fabricate into multilayer printed circuit boards. Pre-preg sheets prepared with fluorocarbon resins can be bonded only at temperatures at which innerlayers melt and lose their dimensional stability.

Other dielectric materials for special purposes are made that particular fibers that have a low $E_r$. Polyaramide fibers together with epoxy resins yield composites with an $E_r$ of about 3.8, and in general aramide boards may have an $E_r$ in the range of 3 to 4. Quartz fibers have also been used in composites, to give materials with $E_r$s similar to those made with polyaramide fibers.

Printed circuit boards made from materials such as PTFE may have an $E_r$ of less than 3. However, some of these "exotic" printed circuit boards are difficult to process and have other properties such as poor mechanical properties that limit their usefulness. For instance, non-woven aramide fibers have high water absorption, and although PTFE has a low dissipation factor, it also has a low mechanical strength and poor adhesive properties. Also, aramide fabrics and fibers, such as PTFE, are expensive and the cost of boards made from exotic materials is considerably higher than with the common substrates discussed above. It is therefore very desirable to develop alternate substrates for the manufacture of FR-1, FR-2, FR-3, CEM-1, CEM-3 and FR-4 boards that possess an $E_r$ in the range of 3–3.5. There is also a need for boards with low dissipation factors, which are easier to process than those presently available and which provide good mechanical and electrical properties.

Substrates with a low dielectric constant can be made in various ways. For example, polyester fibers ($E_r$ of less than 3) can be used instead of glass fibers ($E_r$ of about 6). A drawback of such materials is low resistance to heat and their tendency to melt and loose their desirable properties at higher temperatures. Also polyester fiber has a lower strength relative to glass fiber, which yields less desirable mechanical properties such as dimensional stability.

The dielectric constant of the material from which the board is formed has a direct effect on the performance and speed of circuits built on the board. The increased electrical performance required of circuit boards in modern equipment has prompted a search for ways to reduce the dielectric constant of the materials from which they are made. Air has the lowest $E_r$ of all materials used, but in order for it to be effective it must be stably incorporated within the circuit board. Incorporation of air into a circuit board has been achieved by encapsulating the air in glass in the form of very small, sturdy spheres (hollow glass microspheres). This approach has been used by a number of laminators who mixed hollow glass microspheres made by 3M Co. or the W. R. Grace Co., subsidiary, Emerson & Cuming, with the resin component of the pre-preg.

Chellis et al. (U.S. Pat. No. 5,126,192) teaches hollow glass microspheres added to a resin which is then formed into parts for use in electronics applications that have low $E_r$ and other desirable attributes, the so-called "champagne board." Chellis discloses that very small microspheres may confer a reduced buoyancy on a product relative to larger glass spheres, and that this advantage is gained especially when spheres of about 5 to 25 microns are used. Chellis also discloses the disadvantage that microspheres may be buoyant and require continuous agitation to keep them suspended. Additionally, Chellis discloses that low-shear mixing techniques must be used to avoid damaging the microspheres.

Okada et al. (U.S. Pat. No. 4,661,301) teaches adding glass microspheres to a resin from which flat plates are made by an extrusion process. Okada also discloses a circuit board produced by flanking the extruded flat sheet on one or both sides with a reinforcing resin-saturated fabric and laminating it with copper foil.

Polyclad Corp. recently advertised a low-dielectric-constant reinforced laminate system with hollow glass microspheres distributed throughout a resin matrix. (CircuiTree, pp 42–43, October 1996). The Polyclad material is stated to have a superior $E_r$ without the use of exotic, expensive resins and to yield both a cost reduction and an improvement in quality. Other similar uses of glass spheres in resins for printed circuit board applications are known (U.S. Pat. Nos. 5,308,909, and 5,098,781). All of these methods involve suspending the glass microspheres in the resin component of the board, i.e. the saturant. These methods require that the resin be continually mixed so as to avoid an uneven distribution of microspheres in the resin. Continual mixing tends, however, to damage microsphere fillers during processing.

In the prior art, paper is used in the production of CEM-1 and a variety of FR-boards. In the past, paper for making circuit boards was typically composed of cotton linter fibers, but such paper is now predominantly made from wood fibers. Composites made with such papers are economically attractive and yield boards with good physical properties such as warp, twist and punching. However, boards made from wood fibers have high dielectric constants and low heat dissipative capacities that limit their use to applications for less demanding conditions.

SUMMARY OF THE INVENTION

An invention disclosed herein is a novel circuit board paper, or "pre-preg substrate," for making pre-pregs and circuit boards. The novel pre-preg substrate contains a filler, preferably hollow glass microspheres, that is incorporated directly into the fiber matrix of the substrate. The filler of the present invention is stably associated with the individual fibers of the fiber matrix of the substrate by the action of a flocculant that acts to yield a substantially uniform three-dimensional distribution of the filler throughout the fiber matrix. Other embodiments of the novel pre-preg substrate of the present invention are prepared by adding a filler of hollow glass microspheres alone, polyester fibers alone, polyester plus hollow glass microspheres, or chopped glass fibers plus hollow glass microspheres. Also disclosed herein is a new method by which a filler, such as hollow glass microspheres, is incorporated directly into the pre-preg substrate. In the method of this invention the filler is not mixed with the resin component of a pre-preg, instead the filler is incorporated directly into, and substantially uniformly throughout, the fibrous paper pulp used to prepare the pre-preg substrate.

Yet another embodiment of the invention disclosed herein is a pre-preg formed with the novel pre-preg substrate that has a fiber matrix with an associated filler. The pre-preg of the present invention has a low dielectric constant and is suitable for the manufacture of printed circuit boards to be used under demanding conditions.

It will be obvious to one of skill in the art that a variety of additives that yield pre-pregs with advantageous properties may be incorporated into circuit board papers by the process of the present invention. Such additives are considered to fall within the spirit of the invention.

Paper Making

Paper is generally made from processed wood fibers. Wood is mechanically fibrillated so that water can penetrate and swell the fibers and make them more flexible. This mechanical action, or refining, splits and frays the fibers, producing hair-like microscopic fibrils that contribute to the density and tensile strength of the manufactured paper. Mechanical treatment of wood fibers produces a paper pulp known as "stock" to which other materials, such as fillers, can be added.

The strength of a paper is affected by several characteristics of the component fibers such as the strength of the individual fibers of the stock, the average length of the fibers, the ability of fibers to form interfiber bonds, and the manufacturing process which forms the structure of the sheet. A property of paper stock is measured with a Canadian Standard freeness tester. Freeness relates to the drainage properties of the stock on a wire screen of a paper making machine; a fast-draining stock has a high freeness.

Additives are frequently added to paper stock to improve or change the properties of the final paper, such as the color, opacity or wetability. Thus, titanium dioxide may be added to increase the whiteness of paper. Paper made from wood is naturally absorbent, so to prevent ink soaking into paper, a "size" such as a rosin soap dispersion, or "size," may be mixed with the stock to about 1 to 5 percent of the fiber. A rosin size, however, will not directly adhere to paper fibers so a coupling agent, such as aluminum ions in the form of aluminum sulfate, is used to attach the rosin size firmly to the negatively charged fiber surface. All percentages used herein are by weight unless stated otherwise.

Paper is typically made in a modern paper making machine (e.g. a "Fourdrinier" machine). The machine has various functional parts: starting from the so-called "wet end," are the headbox with a stock distribution system; wire mesh table, where sheet formation and drainage of water occur; press section, which receives the wet sheet from the wire, presses it between felts, and delivers the partially dewatered sheet to the dryer section; dryer section, which receives the sheet from the presses and carries it through a series of rotating, steam-heated cylinders to remove the remaining moisture; a size press, which permits dampening the sheet surface with a solution of starch, glue, or other material to improve the paper surface; calender stack, for compressing and smoothing the sheet; and the reel for taking up the finished paper.

Integrated mechanisms operate in unison in a paper machine, to receive paper stock from the beater, form the stock into a sheet of the desired weight by filtration, to press and consolidate the sheet with removal of excess water, dry the remaining water by evaporation, and wind the travelling sheet into reels of paper. Machine-made paper may be made with a paper weight or "basis weight" from light tissue, about 10 grams per square meter, to boards of over 500 grams per square meter.

The basis weight, the caliper and the density are properties used to describe paper and paperboard products. Basis weight is determined by weighing a sample of not less than about 600 square centimeters at equilibrium under standard conditions (24° C. or 75° F.; 50 percent relative humidity).

The caliper, or thickness, of paper or paperboard is measured by placing a single sheet under a steady pressure of 0.49 to 0.63 kilogram per square centimeter (seven to nine pounds per square inch) between two circular and parallel plane surfaces, the smaller of which has an area of 1.6 square centimeters (0.25 square inch).

The density or specific gravity of paper is calculated from the basis weight and caliper and may vary over a wide range.

The paper industry has developed techniques to lower the density of paper so as to save weight for postal use by incorporating air into the paper. For example, air is incorporated into paper by enclosing it in plastic bubbles (SARAN, Dow Chemical) or in coatings (polystyrene, Rohm & Haas). However, such materials are impractical for the circuit board industry because these plastics are not heat- or solvent-resistant.

The novel pre-preg substrate of the present invention is a non-woven mat that includes a fibrillated fiber matrix such as cellulose (i.e. fibrillated wood pulp or cotton fibers), and a filler such as hollow glass microspheres. Other fillers such as glass fibers (chopped or spun), aramide, polyester, nylon, phenolic, polyimidazole or any other particles, fiber or mixtures thereof that be incorporated into a nonwoven mat can be used in the present invention. The filler can be of any material that has properties that will make a pre-preg useful to the printed circuit board industry.

Other embodiments of the invention may contain binders that improve the electrical strength properties of circuit boards under wet or humid conditions. Such binders may be silicone resins, epoxy resins, polyamide resins or moisture-resistant melamine resins.

A further aspect of the invention disclosed herein is a new paper-making technique used to make the novel pre-preg substrate. This technique is an improvement of techniques used in the paper and nonwoven fabric industry.

A pre-preg substrate of the invention disclosed herein, consisting of a non-woven mat of fibers together with hollow glass microspheres plus other processing aids and ingredients, can be saturated with resins such as phenolic, epoxy, polyimide, cyanoester, polyetherimide, or other suitable polymers, and pressed to make a B-stage pre-preg.

Embodiments of the invention disclosed herein contain a filler consisting of hollow-glass-microspheres, glass fibers, aramide fibers, polyester fibers, nylon fibers, PTFE fibers, polyphenolic fibers, acrylic fibers, ceramic fibers or mixtures of fillers of various kinds.

Embodiments of the invention disclosed herein contain a filler of hollow glass microspheres of a size range from 10 $\mu$m to 150 $\mu$m. In a preferred embodiment the hollow glass microspheres are of a mean particle size of about 54 $\mu$m. Hollow glass microspheres have an $E_r$ of about 1.4, glass fibers have an $E_r$ of about 6, aramide fibers have an $E_r$ of 3.9, and polyester has an $E_r$ of less than 3. By combining these components in various proportions, pre-pregs of this invention are formed and used to make laminates and circuit boards with a variety of properties that show desirable combinations of low permittivity, high resistivity and high flexural strength.

The amount of filler in the pre-preg substrate of the invention disclosed herein may be in the range of from 5% to 50% by weight on a dry-weight basis. Preferably, the amount of filler in the substrate may be in the range of from 5% to 30% by weight. Most preferably the amount of filler in the substrate is 25% by weight.

In yet another embodiment of the invention disclosed herein, the hollow glass microspheres of the filler are coated with a silane coupling agent to additionally promote their localization and attachment to the epoxy resin that is later added to the substrate.

Yet another aspect of this invention is a method or process consisting of a series of steps for fabricating a pre-preg substrate. In the process of this invention, a cellulose fiber mixture is prepared and then refined (i.e. passed through a refining mill) to achieve a certain freeness and provide a fibrillated cellulose fiber suspension with fibers of a length adequate to yield a product with a finished tensile strength of about 17 to 25 lb/in. Filler is added to the cellulose suspension so as to comprise between 5 and 50 percent of the total dry mass. Binders that improve the electrical strength properties of circuit boards under wet or humid conditions may also be added. Binders may be silicone resins, or epoxy, polyamide or moisture-resistant melamine resins.

The stock cellulose suspension prepared as described above is diluted so that the consistency of the stock is from 5–6% to 0.3–1.0% total solids content. A flocculating agent is then added to the stock to aggregate the components of the mixture and form a "flocculated stock." A preferred flocculating agent is a polymer, and may be a medium to high molecular weight cationic, anionic or non-ionic polyacrylamide. In a preferred embodiment of the invention, the flocculating agent is a cationic polyacrylamide. Commercially available materials suitable for use as flocculating agents in the present invention are shown in Table 2.

The flocculated stock is passed over a screen of a paper making machine to form a layer that is then pressed to remove water. Care is taken to avoid pressures that would damage the filler, i.e., rupture the hollow glass microspheres or disrupt fibers such as glass fibers. After drying and calendering the layer with a pressure suitable to keep hollow glass microspheres or glass fibers intact, a finished "dry sheet" is formed. Dry sheets of any thicknesses may be readily formed. Preferably, dry sheets are of a thickness between 9 and 30 thousandths of an inch.

Yet another embodiment of the invention disclosed herein is a pre-preg that contains a fiber matrix and a filler with a low dielectric constant, suitable for the manufacture of printed circuit boards. A component of the pre-preg of this invention is a resin. The resin may be phenolic, epoxy, polyester, polyimide, polyetherimide, polyphenylene oxide, polyphenylene sulfide, polybenzimidazole, cyano esters, PTFE or polyamide resin. To form the pre-preg of the invention dry sheets of the pre-preg substrate are pre-wetted with a solution of water, methyl alcohol, or other alcohols and phenolic resin. Pre-wetting facilitates penetration of a resin mixture into the sheet. Pre-wetting yields "wet sheets." A "pre-wet" sheet, if dried, containing about 6% percent by weight of the resin from the pre-wetting solution. Alternatively, sheets may be pre-wetted with a solution of methyl alcohol, or other alcohols in water. The wet sheet is then passed through a resin bath to yield a "resin coated sheet" containing about 60% percent by weight of the resin. The resin bath contains phenolic, epoxy, polyester or other resin depending on the embodiment of the invention being made. The resin coated sheet is then heated to form a pre-preg. The heating is controlled so that the resin is dried to the B-stage but not cross-linked. Preferably the drying is accomplished at about 180° Celsius.

TABLE 2

Commercially Available Flocculating Agents

| Active Material | Trade Name (description) | Product Description |
| --- | --- | --- |
| POLYACRYLAMIDE Molecular weight range $5 \times 10^5 – 3 \times 10^7$ | NALCO 8681 POLYMER (Nonionic polymer) | polyacrylamide in a hydrocarbon solvent/water emulsion |
| ACRYLAMIDE/ACRYLATE POLYMER Molecular weight range $5 \times 10^5 – 3 \times 10^7$ | NALCO 625 LIQUID POLYMER (Anionic flocculant polymer) | acrylamide/acrylate in a hydrocarbon solvent and water |
| MODIFIED ACRYLAMIDE POLYMER Molecular weight range $5 \times 10^5 – 3 \times 10^7$ | NALCO 7533 LIQUID | acrylamide modified polymer in a hydrocarbon solvent/water emulsion |
| ACRYLAMIDE MODIFIED CATIONIC COPOLYMER Molecular weight range $5 \times 10^5 – 3 \times 10^7$ | NALCO 7530 PAPER PROCESS POLYMER | acrylamide modified cationic copolymer in a water and hydrocarbon solvent emulsion |
| ACRYLAMIDE/ACRYLATE POLYMER Molecular weight range $5 \times 10^5 – 3 \times 10^7$ | NALCO 623-SC RETENTION CONTROL | acrylamide/acrylate polymer in a hydrocarbon solvent and water |
| ACRYLAMIDE MODIFIED CATIONIC COPOLYMER Molecular weight range $5 \times 10^5 – 3 \times 10^7$ | NALCO 7520 RETENTION AID (Cationic flocculant polymer) | acrylamide modified polymer in a hydrocarbon solvent/water emulsion |
| POLYQUATERNARY AMINE Molecular weight range $1 \times 10^5 – 5 \times 10^6$ | NALCO 7527 RET & DRAINAGE AID (Combination coagulant/flocculant) | aqueous solution of a polyquaternary amine water/oil emulsion |

An important aspect of the invention disclosed herein is that the flocculant provides means for ensuring that the filler is substantially uniformly distributed throughout the fiber matrix. Preferably the pre-preg substrate disclosed herein is formed by the use of a flocculating agent that acts to stably associate the filler with the fibers.

Embodiments of the pre-preg invention disclosed herein contain selected fibers and fillers in various proportions as shown in Table 3, below. Pre-preg embodiments comprise epoxy resins and other ingredients that are pressed into laminates.

Compositions of the pre-preg embodiment of the invention disclosed herein are shown in Tables 3 and 4, below.

Different embodiments contain combinations of glass fibers, aramide fibers, polyester fibers and glass microspheres. Other pre-preg embodiments are laminated with one layer of copper foil or with two layers of copper foil, one on each side (double-clad).

DETAILED DESCRIPTION OF THE INVENTION

An embodiment of the invention disclosed herein is a modified paper that can be used in the fabrication of pre-pregs. A novel kind of circuit board paper is prepared by stably associating various fillers with the paper-pulp. The fillers used to form the circuit board paper or pre-preg substrate, modify the electrical and mechanical properties of the resulting circuit board. In particular, a circuit board made with the invention disclosed herein has a significantly reduced dielectric constant compared to conventional circuit boards. CEM-1 boards prepared with the novel pre-preg substrate of the present invention may be used in more demanding areas of application than conventional circuit boards.

In this invention, the fibers of paper are modified during the paper making stage by fibrillating the wood pulp and by fillers are then added to the paper-pulp. As disclosed herein, the choice of fibers and fillers is dictated by the electrical and mechanical properties of the fibers and fillers. The novel paper pulp of the present invention preferably contains hollow glass microspheres alone. Other embodiments of the invention contain polyester fibers alone, polyester plus hollow glass microspheres, or chopped glass fibers plus hollow glass microspheres. It will be obvious to one of skill in the art that a variety of fillers may be used that fall within the spirit of the present invention.

The present invention is further illustrated by reference to the following exemplary disclosure which is provided for purposes of illustration and is not intended to be in any way limitative.

EXEMPLARY METHODS

Pre-preg Substrates

Pre-preg substrates of this invention containing hollow glass microspheres were made on several pilot-size paper-making machines. The paper making systems were identical to full size systems but merely on a smaller scale. The process in each machine was essentially the same and differed only in a certain minor details. Principally, all samples were prepared as follows: wood pulp i.e. the cellulose fibers of softwoods and hardwoods were weighed out and slurried in a pulper with water. The solids content was about 5–6%. This slurry, known as "stock," was then refined by bruising the fibers in a "refiner." Bruising the fibers in a refiner splits the fibers and causes them to undergo fibrillation, this treatment increases the strength of the finished paper. The discovery that underlies the invention disclosed herein is that increased fibrillation allows the filler is to be incorporated into the sheets and retained in the fiber network of the finished paper without significantly affecting the strength of the final paper.

The consistency of the "refined" stock is adjusted by adding water. The filler, i.e., hollow glass microspheres, glass fibers, or polyester fibers is slurried separately in order maintain the integrity of the filler particles and is then added to the refined cellulose fibers. This stock is then diluted further and a retention aid or flocculating agent is added as the stock is pumped through a headbox onto a wire screen of a paper making machine. The flocculating agent acts to promote retention of the filler in the sheet.

The flocculating agent used in the present invention is a medium to high molecular weight liquid polyacrylamide. The flocculating agent may be non-ionic, or may have an anionic or preferably a cationic charge. Nonionic high molecular weight polyacrylamides may be used in the present invention but charged polymers such as acrylamide/acrylate copolymers are preferable. Most preferable are modified polyacrylamides that have a cationic charge. Examples of materials preferable for use in the present invention are NALCO 7530 PAPER PROCESS POLYMER and NALCO 7520 RETENTION AID made by Nalco Chemical Co., Naperville, Ill.

The basic process used to make the paper of this invention is as follows: Paper pulp is slurried in a pulper to disperse all the fibers and to form a stock or "furnish" of a 5–8% total solids by weight. The dispersed fibers are then refined to a certain degree of Canadian Standard freeness in order to yield a finished paper with adequate strength. Fillers, such as hollow glass microspheres, glass fibers, and polyester fibers are added after the refining along with an agent to improve wet strength, such as a polyamide, melamine or other suitable resin. In this invention, the fillers are added after fibrillating the paper pulp fibers so as to avoid damage to the fillers by the action of the refining machine.

Flocculating agents are used in embodiments of this invention to achieve a stable interaction between the fibers of the paper and the filler. Typical flocculating agents used in this invention are charged polymers such as acrylamide/acrylate polymers such as NALCO 625 LIQUID POLYMER, or NALCO 623-SC RETENTION CONTROL or cationic modified acrylamide polymers such as NALCO 7530 PAPER PROCESS POLYMER, or NALCO 7520 RETENTION AID. Suitable flocculating agents made by Nalco Chemical Co. are shown in Table 2, however, those of skill in the art will recognize that many other materials will provide a stable interaction between the paper fibers and the filler. The proper amount of the flocculant, to flocculate the filler and the fibers and optimize the formation of stable complexes, is determined by, a) the relative sizes of the hollow glass microspheres, and b) the size of the fiberglass. The appropriate amount of flocculant may be determined by measuring the filtration rate of the stock. In a particular embodiment of the invention, the flocculant is added to the paper pulp and filler to produce a stock that is then processed further. The concentration of the stock is adjusted to give an appropriate consistency by the addition water, e.g. water is added to dilute the stock to about 0.3% to 0.8% total solids content. If necessary, the pH of the stock is also adjusted to between 6.8 and 8.0 and the stock is applied to the headbox of a paper making machine.

During paper making, the stock is passed over the wire screen of the wet end of the paper making machine. The amount of flocculant used depends on several factors including the amount of filler in the stock, the turbulence as the stock passes over the wire screen of the paper making machine, the retention of filler to be achieved and the desired formation. After the stock has passed the wire screen section of the machine, it is passed through a press to remove water and compress the sheet to an appropriate density e.g. 20 to 25 lb/cubic foot.

Paper sheets for use in this invention are formed using standard paper making techniques. Care should be exercised however, to avoid excessively calendering the sheet, otherwise the hollow glass microspheres are susceptible to being crushed or damaged. Pressure-resistant hollow glass microspheres are preferable. Maximum functionality in the pre-preg substrate is achieved with a high concentration, uniform distribution and efficient retention of the glass microspheres. The sheet formed by the instant invention is of uniform dimensions and does not suffer from two-sidedness that occurs with a non-uniform distribution of the components. High quality pre-pregs prepared from the pre-preg substrate of this invention are characterized by a uniform distribution of fibers and filler.

In another embodiment of the invention, the hollow glass microspheres are coated with a silane coupling agent that will react with the resin system that is added later. Such coupling agents promote the bonding of the resin to the glass microspheres, increase the strength of the final product and prevent the formation of voids in the product. Embodiments of the invention that incorporate glass fibers may also beneficially incorporate silane coupling agents.

Seven examples of paper of the present invention were produced. The properties of these exemplary papers of the invention were compared with a commercially made control paper made on a commercial machine at FiberMark, Inc., Owensboro, Ky. Exemplary papers A, B, C and D were made on a small 12" paper making machine in SUNY College of Environmental Science and Forestry at Syracuse University. Exemplary papers E, F and G were made at Western Michigan University, Kalamazoo, Mich., on a pilot machine of the WMU Department of Paper Science and Printing Technology. Those of skill in the art will realize however, that the pre-preg substrate invention disclosed herein may be made in any of a number of ways known to those of skill in the art. The properties of the control paper and the exemplary pre-preg substrates are shown in Table 3. The data in Table 3 allows the properties of exemplary papers A through G to be compared to the properties of a commercial paper identified as the experimental "control."

TABLE 3

Exemplary Pre-preg substrates

| | Paper type | | | | | | | |
|---|---|---|---|---|---|---|---|---|
| | Control | Ex. A | Ex. B | Ex. C | Ex. D | Ex. E | Ex. F | Ex. G |
| Bleached Kraft Pulp | 100 | 75 | 50 | 50 | 75 | 65 | 80 | 90 |
| Glass microspheres average size 50 μm | | | 25 | 25 | 25 | 20 | 15 | 5 |
| ¼" glass fibers | | | | | | 15 | 5 | 5 |
| ¼" polyester fibers | | 25 | 25 | 25 | | | | |
| Paper properties | | | | | | | | |
| Basis weight (lb/3000 sq. ft.) | 126.5 | 129.5 | 89.1 | 89.1 | 102.9 | 86.6 | 89.3 | 96.7 |
| Caliper (Mils) | 19 | 23.6 | 20.3 | 20.3 | 20.8 | 21.3 | 19.6 | 19.3 |
| Density (lb/cu. ft) | 26.5 | 22 | 17.6 | 17.6 | 19.8 | 16.3 | 18.2 | 20.1 |

The density of pre-preg substrate is of critical importance because pressing the sheet to remove the water also decreases the void volume. The amount of resin that can be absorbed by paper is affected by both the void volume and the degree of water removal. However, complete removal of water is generally not desirable during preparation of paper for use in circuit board manufacture. Water is removed by applying pressure to the paper by press rolls and by heating. Pressure is expressed in pounds-per-square-inch/gauge ("PSIG") and should be controlled to avoid damage to the fibers and the filler of the paper. After the paper emerges from the press, it is dried on steam-heated drier cans. For the purposes of the present invention, it has been found that it is best to dry the pre-preg substrate so that the paper contains about 1–1.5% moisture. At this degree of dryness, the pores of the fibers are closed and resistant to the penetration of moisture. The paper emerging from the drier is passed through a calender under light pressure. It is important that only light pressure be used to avoid damage to the filler, e.g. glass fibers and hollow glass microspheres.

Several properties of the paper sheet are important. One important property is the thickness of the sheet. Sheets of the invention disclosed herein are preferably formed to be from 10 to 45 mils in thickness. Most preferably, for the manufacture of CFMs sheets of the invention are formed to be from 18 to 23 mils in thickness. Other important properties are the basis weight and the wet tensile-strength which is important for later processing of the paper during production of pre-pregs.

Exemplary Pre-pregs

Pre-pregs were prepared from the pre-preg substrates of the present invention by saturating the paper with resin. Pre-preg preparation was a three step process comprising a "wetout" step, a "saturation" step, and a "drying" step. In the wetout step, the paper was wetted-out to swell the sheet. This made the pre-preg substrate receptive to the epoxy resin mix. Without a wetout step, sufficient resin pickup in the saturation step was not achieved. Resin saturation was achieved following the "wetout" step, by passing the wetted sheet through a resin bath.

The wetting fluid consisted of a mixture of 25% water, 50% methyl alcohol and 25% phenolic resin (63–67% Resilam, GP 5154 by Georgia Pacific). It was discovered that accurate control of wetting fluid pickup was necessary to get satisfactory resin uptake. A pickup of about 6–8% wetting fluid proved to be optimal. After the wetout, the sheet was slowly moved to the resin saturant for the second step. The sheet was passed through the resin saturation solution to achieve a pickup of 60% resin (+/−2%). An exemplary formula for the resin saturation solution is shown in Table 4.

TABLE 4

Composition of Exemplary Resin Saturation Solution

| Component | Parts per Hundred (by weight) |
|---|---|
| Dimethyl formamide | 21.3 |
| EPON 829 (Shell Chemical Co.) | 37.2 |
| Tetra Bromo Bisphenyl A | 16.0 |
| Phenolic resin (BRWE 5833) (Shell Chemical Co.) | 10.6 |
| Plasticiser (Flexol) (Shell Chemical Co.) | 10.6 |
| Antimony oxide | 4.3 |
| Benzyl Dimethylamine | 0.32 |

In the third step the saturated paper is dried to form a pre-preg by passage through a heated flotation dryer. The temperature in the dryer is kept at 200 Celsius or below to avoid substantial curing of the resin. Passage through the dryer causes the resin to solidify to the B-stage, and evaporates volatiles such as water, alcohol, and dimethyl formamide. Substantial curing of the resin does not occur. A low level of remaining volatiles does not interfere with the properties of the final product. However, the drying process is adjusted so that remaining volatiles constitute no more than about 1.5% of the material.

Four aspects of production are controlled to produce good quality pre-pregs. Prewet resin pickup, volatile content, resin content and resin flow are each accurately controlled. The resin content is controlled by a gap setting on the saturator. The resin flow is controlled by the amount of prewet resin pickup and by the oven temperature and exposure time.

Table 5 shows the process conditions used to make the exemplary pre-pregs of the present invention at Dyno Overlays, Tacoma, Wa. Table 5 also shows the properties of circuit boards produced with pre-preg substrates of this invention.

solvent of the wetting fluid. Papers D, E, and F differed in the amount of microspheres or glass fibers and all yielded circuit boards with lower dielectric constants, exemplary paper E having the lowest value. An increased amount of glass fibers improved the flexural strength but increased the dielectric constant.

Laminates were made in three forms: without copper foil, single-clad with one layer of copper foil and double-clad

TABLE 5

Process Conditions used to Prepare Pre-pregs

| Process Conditions | Paper type | | | | | | | |
|---|---|---|---|---|---|---|---|---|
|  | Control | Ex. A | Ex. B | Ex. C | Ex. D | Ex. E | Ex. F | Ex. G |
| Treater (° C.) | 180 | 180 | 180 | 180 | 180 | 180 | 180 | 180 |
| Temperature (° C.) | 200 | 200 | 200 | 200 | 200 | 200 | 200 | 200 |
| Speed (fpm) | 1.25 | .96 | 1.55 | 1.41 | 1.4 | 1.43 | 1.43 | 1.47 |
| Pre-wet pickup (weight %) | 8 | 18 | 6.9 | 5.8 | 5.8 | 5.8 | 5.0–6.0 | 7.0 |
| Resin content (weight %) | 61.2 | 54 | 60 | 60 | 58 | 61.7 | 61.4 | 56.6 |
| Flow (weight %) | 2.1 | 0 | 2.1 | 11 | 4.1 | 6.7 | 13.3 | 10.1 |
| Volatiles (weight %) | 1.2 |  | 1.4 | 3 |  | 1.3 | 1.4 | 1.3 |

The circuit board made with exemplary paper A had a low resin content and zero resin flow and failed a solder float and dip test at 500 and 550 degrees Fahrenheit. Circuit boards made with exemplary papers A, B, C and D had lower measured dielectric constants when first received without any special conditioning ("A" conditions) or when measured after immersion in distilled water for 24 hours at 23° C. ("D-24/23" conditions). Exemplary paper A contained 25% with a layer of copper foil on each side. Table 6 shows the properties of laminates made from the pre-preg substrates of this invention. Laminates made with pre-preg paper A did not pass the thermal test because too much prewet pickup resulted in deficient resin flow in the lamination step. Laminates made with papers B and C were compositionally similar, both incorporating glass microspheres and both demonstrating the effectiveness of the invention.

TABLE 6

Properties of Circuit Boards Formed from Pre-preg Substrates of this Invention

|  | Paper type | | | | | | | |
|---|---|---|---|---|---|---|---|---|
|  | Control | Ex. A | Ex. B | Ex. C | Ex. D | Ex. E | Ex. F | Ex. G |
| Dielectric constant (A condition) | 3.96 | 3.29 | 3.18 | 3.49 | 3 | 3.59 | 3.63 | 3.83 |
| Dielectric constant (D-24/23 condition) | 4.07 | 3.5 | 3.19 | 3.56 | 3.1 | 3.66 | 3.69 | 3.86 |
| Dissipation factor (A condition) | 0.024 | 0.021 | 0.02 | 0.023 | 0.024 | 0.02 | 0.02 | 0.024 |
| Dissipation factor (D-24/23 condition) | 0.024 | 0.024 | 0.021 | 0.024 | 0.027 | 0.021 | 0.022 | 0.024 |
| Flexural strength lengthwise (Kg/M$^2$) | 51994 | 42018 | 51035 | 55136 | 48026 | 53709 | 56838 | 60225 |
| Water Absorption (weight %) | 0.1 | 0.77 | 0.12 | 0.1 | 0.2 | 0.09 | 0.1 | 0.09 |
| Surface resistivity (megohms) |  | 1.6 | 1.5 | 18 | 1.5 | 1.8 | 1.2 | 65 |
| Volume resistivity (megohms) |  | 20 | 5.2 | 20 | 5.8 | 3.9 | 7.3 | 6.7 | polyester fiber and exemplary papers B and C contained 25% polyester fiber and 25% glass microspheres. Exemplary paper D contained paper pulp and 25% glass microspheres. The results show that while the polyester fiber decreases the dielectric constant, the addition of glass microspheres gives even a greater reduction. Even lower dielectric constants were exhibited by circuit boards made with paper pulp and glass microspheres. Papers B and C differed by the time of treatment and amount of wetout pick-up. It was found that decreasing the time for pick up in the wetout bath decreased the amount of pick-up of phenol resin. This yielded an increased flow and volatile content, i.e. retention of the The examples shown herein reveal the potential for forming improved pre-pregs for making laminates and circuit boards with better electrical and mechanical properties at reduced cost, through modification of the pre-preg substrate.

Seven exemplary papers of the present invention were produced on a pilot paper-making machine. The paper composition was varied from paper to paper by addition of selected fibers and fillers in various proportions. These papers were then prewetted and saturated with epoxy resins and other ingredients common to such varnishes. The B-stage panels or pre-pregs were pressed into laminates and tested according to the procedures of the Institute for Interconnecting and Packaging Electronic Circuits.

Tables 3, 4 and 5 summarize the properties of the pre-preg substrate trial sheets. In Table 4, the composition of the papers is listed. A number of different combinations of glass fibers, polyester fibers and glass microspheres were tested. Table 5 shows are the relevant treating conditions and the actual properties of the pre-pregs. Table 6 shows the properties of laminates made from the pre-preg substrates of this invention. Laminates incorporating glass microspheres and demonstrate the effectiveness of the invention.

The present invention is illustrated by reference to the preceding disclosure. One skilled in the art will readily appreciate that the present invention is well adapted to carry out the objects and obtain the ends and advantages mentioned, as well as those inherent therein. The components, methods, procedures and techniques described herein are presently representative of the preferred embodiments, are intended to be exemplary, and are not intended as limitations on the scope of the present invention. Changes therein and other uses will occur to those skilled in the art which are encompassed within the spirit of the invention and are defined by the scope of the appended claims.

Having thus described the invention what it is desired to claim and protect by letters patent is:

1. A pre-preg substrate having the form of a non-woven mat, adapted for the manufacture of pre-pregs and laminates for printed circuit boards, said pre-preg substrate comprising a fibrillated fiber matrix, a flocculating agent, and a low dielectric constant filler substantially uniformly distributed throughout said fibrillated fiber matrix.

2. The pre-preg substrate of claim 1, wherein:
    said fibrillated fiber matrix comprises fibrillated wood pulp or cotton fibers; and
    said filler is selected from the group consisting of hollow glass microspheres, chopped glass fibers, spun glass fibers, aramide fibers, polyester fibers, nylon fibers, polytetrafluoroethylene fibers, polyphenolic fibers, acrylic fibers, ceramic fibers and mixtures of any of the foregoing.

3. The pre-preg substrate of claim 1, wherein said flocculating agent is a polymer having a molecular weight in a range from $1 \times 10^5$ to $3 \times 10^7$.

4. The pre-preg substrate of claim 3, wherein said flocculating agent is an anionic, cationic or nonionic polyacrylamide.

5. The pre-preg substrate of claim 3, wherein said flocculant is a cationic polyacrylamide.

6. The pre-preg substrate of claim 1, wherein said filler is hollow glass microspheres substantially uniformly distributed throughout said fibrillated fiber matrix.

7. The pre-preg substrate of claim 6, wherein said filler is from 5% to 50% by weight of said pre-preg substrate.

8. The pre-preg substrate of claim 6, wherein said filler is from 5% to 30% by weight of said pre-preg substrate.

9. The pre-preg substrate of claim 6, wherein said filler is about 25% by weight of said pre-preg substrate.

10. The pre-preg substrate of claim 6, wherein said filler is hollow glass microspheres having an average diameter of about 50 µm and a size range from 10 µm to 150 µm.

11. The pre-preg substrate of claim 10, wherein said hollow glass microspheres are from 5% to 50% by weight of said pre-preg substrate.

12. The pre-preg substrate of claim 10, wherein said hollow glass microspheres are from 5% to 30% by weight of said pre-preg substrate.

13. The pre-preg substrate of claim 10, wherein said hollow glass microspheres are about 25% by weight of said pre-preg substrate.

14. The pre-preg substrate of claim 1, wherein said filler is hollow glass microspheres coated with a silane coupling agent.

15. The pre-preg substrate of claim 1, further comprising:
    a binder selected from the group consisting of silicone resins, epoxy resins, polyamide resins and moisture-resistant melamine resins;
    said binder being a binder that improves the dielectric properties of a circuit board made from said pre-preg under wet or humid conditions.

16. A pre-preg made by the following method:
    (a) preparing a paper pulp comprising paper fibers;
    (b) refining said paper pulp so as to fibrillate said fibers;
    (c) adding a filler selected from the group consisting of hollow glass microspheres, glass fibers, aramide fibers, polyester fibers, nylon fibers, polytetrafluoroethylene fibers, polyphenolic fibers, acrylic fibers, ceramic fibers and mixtures of any of the foregoing, to form between five and ten percent of said pulp,
    (d) adding an agent selected from the group consisting of silicone resins, epoxy resins, polyamide resins and moisture-resistant melamine resins, to form a stock suspension;
    (e) adjusting the consistency of said stock suspension to be from 3 to 10 grams per liter;
    (f) adding to said stock suspension a flocculating agent to form a flocculated stock;
    (g) passing said flocculated stock over a screen to form a stock layer;
    (h) pressing said stock layer to remove water;
    (i) heat drying said stock layer;
    (j) calendering said stock layer under a pressure suitable to maintain said glass microspheres and said glass fibers intact and to yield a finished sheet of a thickness between ten and forty-five thousandths of an inch;
    (k) wetting said finished sheet with a solution comprising water, methyl alcohol, and phenolic resin so as to yield a wet sheet wherein 6 to 8 percent of said wet sheet is said solution; and
    (l) passing said wet sheet through a resin saturation solution comprising resin form the group consisting of phenoxy resin, epoxy resin and polyester resin so as to form a saturated sheet, wherein 60 percent of said saturated sheet is said resin saturation solution;
    (m) drying said saturated sheet at about 180° Celsius so as to dry but not cross link said resin.

17. A pre-preg comprising:
    a fibrillated fiber matrix;
    a flocculating agent;
    a filler of low dielectric constant stably associated with said fibrillated fiber matrix, and
    a resin selected from the group consisting of phenolic, epoxy, cyanoester, polyimide, polyetherimide, polyphenylene oxide, polyester, polybenzimidazole, polytetrafluoroethylene and polyphenylene sulfide resins.

18. The pre-preg of claim 17, wherein said filler with a low dielectric constant, is selected from the group consisting of hollow glass microspheres, chopped glass fibers, spun glass fibers, aramide fibers, polyester fibers, nylon fibers, polytetrafluoroethylene fibers, polyphenolic fibers, acrylic fibers, ceramic fibers and mixtures of any of the foregoing.

19. A laminate board for a printed circuit comprising:
    one or more pre-preg layers;

each of said pre-preg layers comprising a fibrillated fiber matrix, a filler, a flocculating agent, and a thermosetting resin;

said filler being a material of low dielectric constant selected from the group consisting of hollow glass microspheres, chopped glass fibers, spun glass fibers, aramide fibers, polyester fibers, nylon fibers, polytetrafluoroethylene fibers, polyphenolic fibers, acrylic fibers, ceramic fibers and mixtures of any of the foregoing and being stably associated with said fibrillated fiber matrix, and said resin being selected from the group consisting of phenolic, epoxy, cyanoester, polyimide, polyetherimide, polyphenylene oxide, polyester, polybenzimidazole, polytetrafluoroethylene and polyphenylene sulfide resins.

20. The laminate board for a printed circuit of claim 19, also comprising one or more metal foil layers bound to said pre-preg layers.

21. The laminate board for a printed circuit of claim 20, wherein said metal foil layers comprise copper.

22. The pre-preg of claim 17, wherein said flocculating agent is an anionic, cationic or nonionic polyacrylamide.

23. The pre-preg of claim 22, wherein said flocculating agent is a cationic polyacrylamide.

24. The pre-preg of claim 22, wherein said flocculating agent has a molecular weight in a range from $1 \times 10^5$ to $3 \times 10^7$.

25. The pre-preg of claim 24, wherein said flocculating agent is a cationic polyacrylamide.

* * * * *